(12) United States Patent
Chen et al.

(10) Patent No.: US 9,285,627 B2
(45) Date of Patent: Mar. 15, 2016

(54) DISPLAY MODULE HAVING A LIGHT SOURCE

(71) Applicant: Innolux Corporation, Miao-Li County (TW)

(72) Inventors: Fu-Cheng Chen, Miao-Li County (TW); Jeng-Wei Yeh, Miao-Li County (TW); Kuei-Ling Liu, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 14/054,919

(22) Filed: Oct. 16, 2013

(65) Prior Publication Data
US 2014/0132886 A1 May 15, 2014

(30) Foreign Application Priority Data

Nov. 14, 2012 (CN) .......................... 2012 1 0455591

(51) Int. Cl.
*G02F 1/1335* (2006.01)
*H01L 51/52* (2006.01)
*H01L 27/32* (2006.01)

(52) U.S. Cl.
CPC ........ *G02F 1/133514* (2013.01); *H01L 27/322* (2013.01); *G02F 2001/133624* (2013.01)

(58) Field of Classification Search
USPC ............ 313/500, 501, 506, 112; 349/106, 61, 349/62, 104, 12; 362/612, 97.3, 230, 555, 362/583, 235, 249.02, 257
See application file for complete search history.

(56) References Cited

U.S. PATENT DOCUMENTS

| | | | |
|---|---|---|---|
| 2007/0146584 A1* | 6/2007 | Wang et al. ................... | 349/106 |
| 2008/0143932 A1 | 6/2008 | Cheng et al. | |
| 2012/0008065 A1* | 1/2012 | Im et al. .......................... | 349/62 |
| 2012/0099054 A1* | 4/2012 | Takeuchi et al. ............... | 349/98 |
| 2012/0162573 A1 | 6/2012 | Takahashi et al. | |

OTHER PUBLICATIONS

EP Search Report dated Mar. 3, 2014.
Willem den Boer: "Active Matrix Liquid Crystal Displays", 2005, Elsevier, Oxford, UK, XP002720430, ISBN: 9780750678131.

* cited by examiner

*Primary Examiner* — Ashok Patel
(74) *Attorney, Agent, or Firm* — McClure, Qualey & Rodack, LLP (57) ABSTRACT

A display module having a light source includes a display unit. The display unit includes a first substrate, a second substrate opposite to the first substrate, a display medium and a green filter layer. The display medium is disposed between the first substrate and the second substrate. The green filter layer is disposed on the first substrate or the second substrate. When the wavelength of the light is between 380 nm and 780 nm, the spectrum of the light source passing through the green filter layer corresponds to a first energy. When the wavelength of the light is between interval of 660 and 780 nm, the spectrum of the light source passing through the green filter layer corresponds to a second energy. The ratio of the second energy to the first energy is less than 2%.

15 Claims, 7 Drawing Sheets

DISPLAY MODULE HAVING A LIGHT SOURCE

This application dams the benefit of People's Republic of China application Serial No. 201210455591.2, filed Nov. 14, 2012, the subject matter of which is incorporated herein by reference.

BACKGROUND OF THE INVENTION

1. Field of the Invention

The invention relates in general to a display module, and more particularly to a display module capable of resolving the leaking problem of a green filter layer in a red light region.

2. Description of the Related Art

Along with the advance in technology, display products have become popular in people's daily life. Display products generate bright colors through the use of a color filter (CF) which filters off the light of the light source and displays the desired quality of colors.

Let the liquid crystal display (LCD) be taken for example. The LCD, being a non-active light-emitting element, firstly uses an internal backlight unit or an external ambient light (a reflective or semi-transmitting LCD) as the light source, uses a driving circuit to control liquid crystal molecules to form grey scale display, provides colors through the red (R)/green (G)/blue (B) filter layers of the color filter, and adjusts the RGB ratios, such that a color display frame can be displayed in a full-color mode.

As the markets have strong demand for high resolution and high contrast display products, the color filter has become a crucial factor to the colorization effect of the LCD. In an ideal color filter, each color filter allows only the light whose wavelength belongs to a specific range to pass through. Light leak occurs when the wavelength of the light passing through the color filter is outside the specific range. The occurrence of light leak affects the chromaticity coordinates of the white or RGB dots, and accordingly deteriorates the display effect and quality. However, due to the material characteristics, the color filters currently available still cannot achieve the ideal state of having no leaking of the light of other colors, and cannot meet the market demand and future trend.

SUMMARY OF THE INVENTION

The disclosure is directed to a display module capable of reducing the leaking problem of a green filter layer by controlling a ratio between the spectrums of a light source and the green filter layer within different wavelength intervals.

According to one embodiment of the disclosure, a display module having a light source is disclosed. The display module comprises a display unit. The display unit comprises a first substrate, a second substrate opposite to the first substrate, a display medium and a green filter layer disposed on the first substrate or the second substrate. A spectrum between 380 nm and 780 nm of wavelength of the light source passing through the green filter layer corresponds to a first energy. A spectrum between 660 nm and 780 nm of wavelength of the light source passing through the green filter layer corresponds to a second energy. A ratio of the second energy to the first energy is less than 2%.

According to another embodiment of the disclosure, a display module having a light source is disclosed. The light source has a normalized emission spectrum. The display module comprises a display unit. The display unit comprises a first substrate, a second substrate opposite to the first substrate, a display medium and a green filter layer. The display medium is disposed between the first substrate and the second substrate. The green filter layer is disposed on the first substrate or the second substrate, and has a normalized transmission spectrum. A product of a first illumination intensity value corresponding to a maximum peak wavelength of the normalized emission spectrum between 480 nm and 660 nm of wavelength of the light source and a first transmittance intensity value corresponding to the maximum peak wavelength of the normalized transmission spectrum of the green filter layer is a first product value. A product of a second illumination intensity value of the emission spectrum and a second transmittance intensity value of the transmission spectrum corresponding to a cross-point between the emission spectrum and the transmission spectrum between 660 nm and 780 nm of wavelength is a second product value. A ratio of the second product value to the first product value is less than 2%.

The above and other aspects of the disclosure will become better understood with regard to the following detailed description of the preferred but non-limiting embodiment(s). The following description is made with reference to the accompanying drawings.

DETAILED DESCRIPTION OF THE INVENTION

Figure 1A:
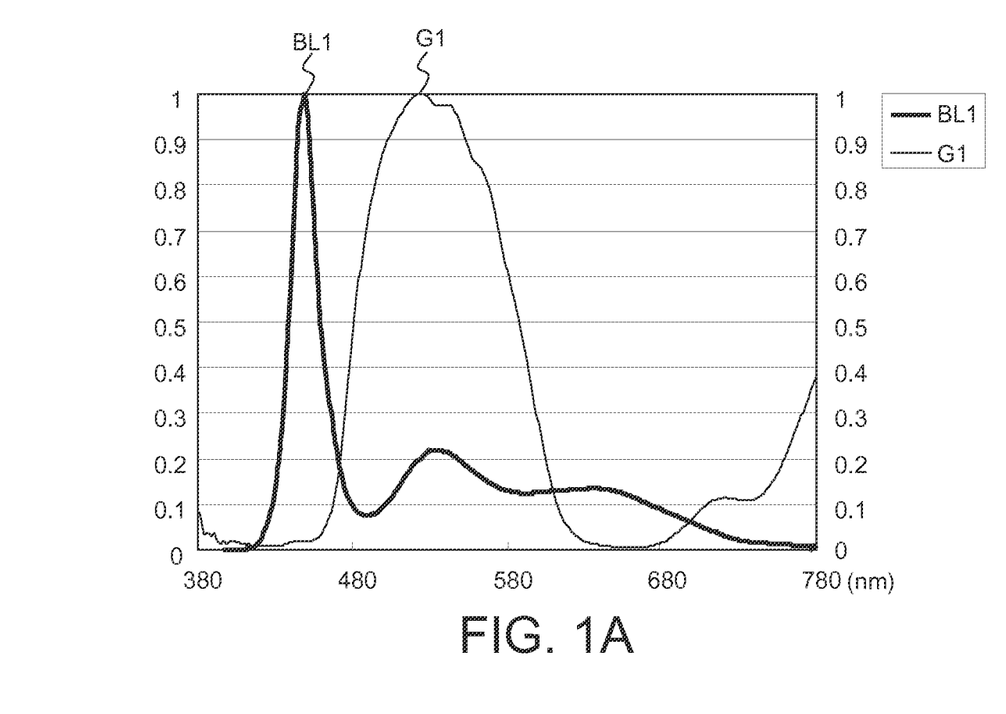
FIG. 1A shows a schematic diagram of a normalized emission spectrum of a light source and a normalized transmission spectrum of a green filter layer.

FIG. 1A shows a schematic diagram of a normalized emission spectrum of a light source and a normalized transmission spectrum of a green filter layer. Referring to FIG. 1A, the emission spectrum of the light source is denoted by a curve BL1. A horizontal axis of the diagram corresponds to an emission wavelength of the visible light of the light source as nanometer (nm) which is a unit of wavelength. The wavelength of the spectrum of the visible light is between 380 nm and 780 nm. A left-side vertical axis of the diagram corresponds to the illumination intensity of the light source. The illumination intensity (in an arbitrary unit) is shown by a relative value based on the maximum value as 1. The light source has a blue light region, a green light region, and a red light region (not illustrated) in sequence in a direction from short wavelength to long wavelength.

In FIG. 1A, a curve G1 denotes a normalized transmission spectrum of the green filter layer. A horizontal axis of FIG. 1A corresponds to the wavelength range of the visible light able to pass through the green filter layer. The unit of the wavelength is nm. A right-side vertical axis corresponds to the transmission rate of the light able to pass through the green filter layer. The transmission rate (in an arbitrary unit) is shown by a relative value based on the maximum value as 1.

Figure 1B:
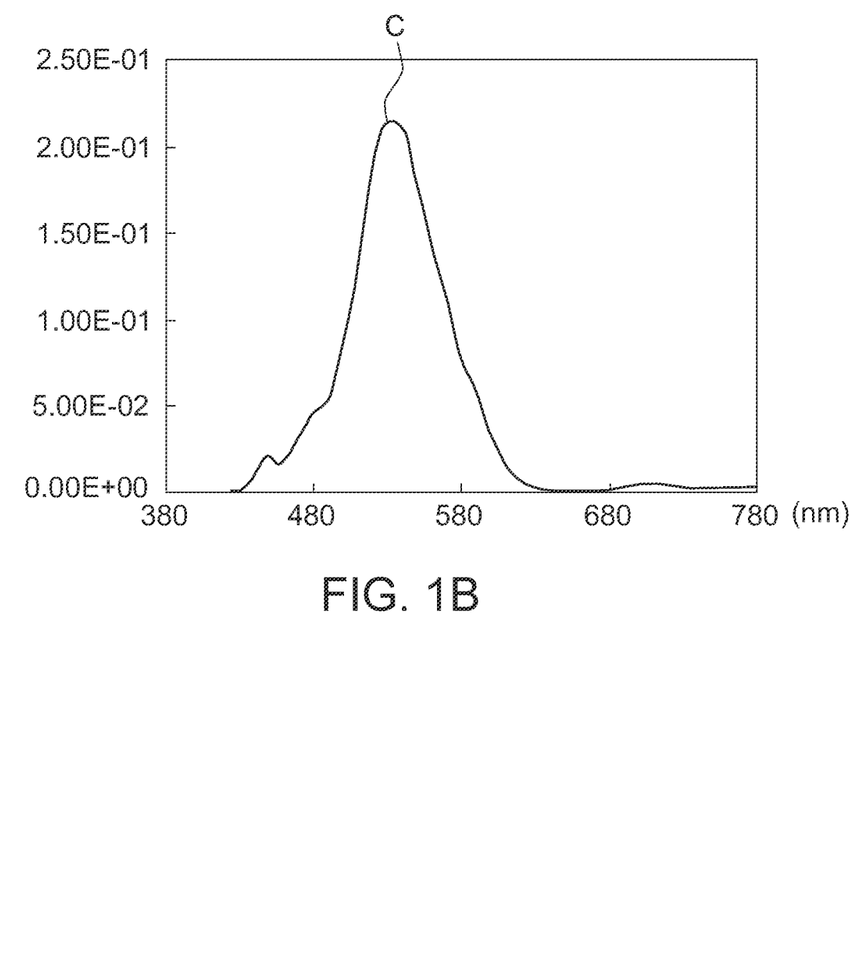
FIG. 1B shows a diagram of an multiplication spectrum of a relative transmission energy of the light source of FIG. 1A passing through a green filter layer and a liquid crystal.

FIG. 1B shows a diagram of a multiplication spectrum of a relative transmission energy of the light source of FIG. 1A passing through the green filter layer and a liquid crystal. An integral area of the multiplication spectrum C of FIG. 1B over the wavelength interval of the visible light is a transmission energy of the light source passing through the green filter layer and the liquid crystal. As indicated in FIG. 1B, there is a transmitting light of the red light region between 660 nm and 780 nm of wavelength. Therefore, it is known that when the green filter layer is used, there is an existence of the transmitting light in the red light region between 660 nm and 780 nm of wavelength. FIG. 1B is exemplified by an LCD display in which a display medium providing grey scales is a liquid crystal material. In other embodiments, if an OLED display, in which an OLED emits a white light and is functioned as a display medium providing grey scales and a light source at the same time, is used, there is still a transmitting light in the red light region between 660 nm and 780 nm of wavelength after the light source passes through the green filter layer. In other embodiments, no matter what type of display is used, there is a transmitting light in the red light region between 660 nm and 780 nm of wavelength as long as the display is used in incorporated with the green filter layer. If the light source has the transmitting light in the red light region passing through the green filter layer, chromaticity coordinates of white dots will be affected.

The energy of the light source between 380 nm and 780 nm of wavelength passing through the green filter layer is defined as a first energy. The energy of the light source in the red light region between 660 nm and 780 nm passing through the green filter layer is defined as a second energy, That is, the first energy is the integral area of the multiplication spectrum C over the wavelength between 380 nm and 780 nm, and the second energy is the integral area of the multiplication spectrum C over the wavelength between 660 nm and 780 nm. If the ratio of the second energy to the first energy can be lowered, the displacement in the chromaticity coordinates of white dots will be reduced.

Figure 2:
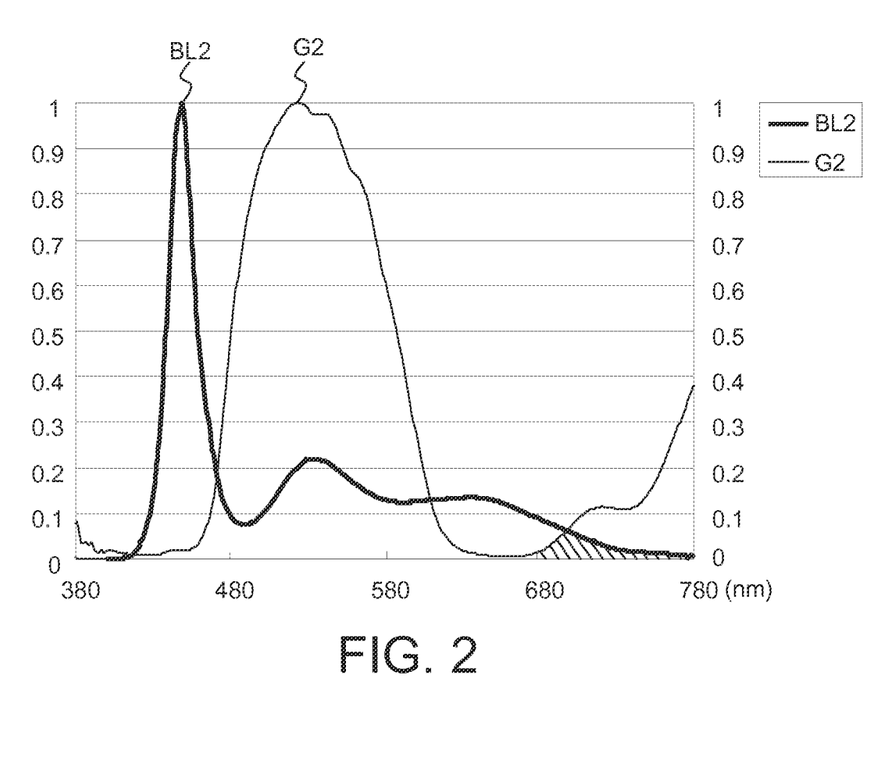
FIG. 2 shows a schematic diagram of a normalized emission spectrum of a light source and a normalized transmission spectrum of a green filter layer.

FIG. 2 shows a schematic diagram of a normalized emission spectrum of the light source and a normalized transmission spectrum of the green filter layer. A curve BL2 denotes an emission spectrum of the light source. The emission spectrum is measured by using three diffusion sheets disposed in the backlight unit. In FIG. 2, the horizontal axis corresponds to the emission wavelength of the light source (the unit of the wavelength is nm), the left-side vertical axis of FIG. 2 corresponds to the illumination intensity of the light source. The illumination intensity (in an arbitrary unit) is shown by a relative value based on the maximum value is 1.

In FIG. 2, a curve G2 denotes a transmission spectrum of the green filter layer, the horizontal axis corresponds to the wavelength range of the light (the unit is nm) able to pass through the green filter layer. The right-side vertical axis corresponds to the transmission rate of the green filter layer for the light. The transmission rate (in an arbitrary unit) is a relative value based on the maximum value is 1.

Referring to FIG. 2, within the entire emission area (between 380 nm and 780 nm of wavelength) of the visible light of the light source, the overlapping part between the transmission spectrum G2 of the green filter layer and the emission spectrum BL2 of the light source is the part of the entire emission area of the visible light of the light source that will pass through the green filter layer. However, within the red light region (between 660 nm and 780 nm of wavelength), the transmission spectrum G2 of the green filter layer partly overlaps the emission spectrum BL2 of the light source (as indicated by the slashed area in FIG. 2). This area is the part that the light source of the red light region will pass through the green filter layer, and is an area in which red light leaks.

A relative light emission energy G of the light source after passing through the green filter layer and the liquid crystal, can be calculated according to the formula: $G=\int BLU(\lambda) \times GCF(\lambda) \times CELL(\lambda) d\lambda$. BLU ($\lambda$) denotes the emission spectrum of the light source. GCF ($\lambda$) denotes the transmission spectrum of the green filter layer. CELL ($\lambda$) denotes the total transmission spectrum of the remaining part of the display unit exclusive of the photoresist material (such as CF). Meanwhile, the emission energy G can be obtained by bringing wavelengths of a particular light band to the upper limit and the lower limit of the integral formula.

Therefore, the relative light emission energy of the light source after passing through the green filter layer and the liquid crystal is $G_{total}$, and can be calculated according to the formula: $G_{total}=\int_{380}^{780} BLU(\lambda) \times GCF(\lambda) \times CELL(\lambda) d\lambda$. The relative light emission energy of the light source of the red light region after passing through the green filter layer and the liquid crystal is $G_{Rleakage}$, and can be calculated according to the formula: $G_{R\ leakage}=\int_{660}^{780} BLU(\lambda) \times GCF(\lambda) \times CELL(\lambda) d\lambda$. The red light leak ratio is the ratio of $G_{Rleakage}$ to $G_{total}$. That is, $\%_{R\ leakage}=G_{R\ leakage}/G_{total}$. To resolve the red light leak occurring to the green filter layer, the range of the slashed area must be reduced, that is, the overlapping part between the emission spectrum of the light source and the green filter layer in the red light region must be reduced. The above formula is exemplified by the use of LCD display. It can be understood that when the OLED, which emits a white light, is used as the light source, the energy integral formula is an multiplication integral of the emission spectrum of the light source and the transmission spectrum of the green filter layer.

Within the wavelength between 380 nm and 780 nm, the energy $G_{total}$ denoting the light energy of the light source passing through the green filter layer is the first energy. Within the wavelength between 660 nm and 780 nm, the energy $G_{Rleakage}$ denoting the light energy of the light source passing through the green filter layer is the second energy. Therefore, if the overlapping between the emission spectrum BL2 of the light source and the transmission spectrum G2 of the green filter layer in the red light region can be reduced, the ratio of the second energy to the first energy can be reduced accordingly.

The overlapping part between the emission spectrum of the light source and the transmission spectrum of the green filter layer between 660 nm and 780 nm Can be reduced by adjusting the kinds and composition ratio of materials of the light source in the red light region of the emission spectrum, to reduce the ratio of the second energy to the first energy, to reduce the transmittance intensity of the light source with respect to the green filter layer within the wavelength between 660 nm and 780 nm. The light source of the red light region can be generated by a group consisting of a red fluorescent powder, a red light emitting diode chip, a red quantum dot, an OLED and a combination thereof. The red fluorescent powder may comprise sulfide, nitride or silicide. The material type or composition ratio of the fluorescent powder can be adjusted.

Figure 3:
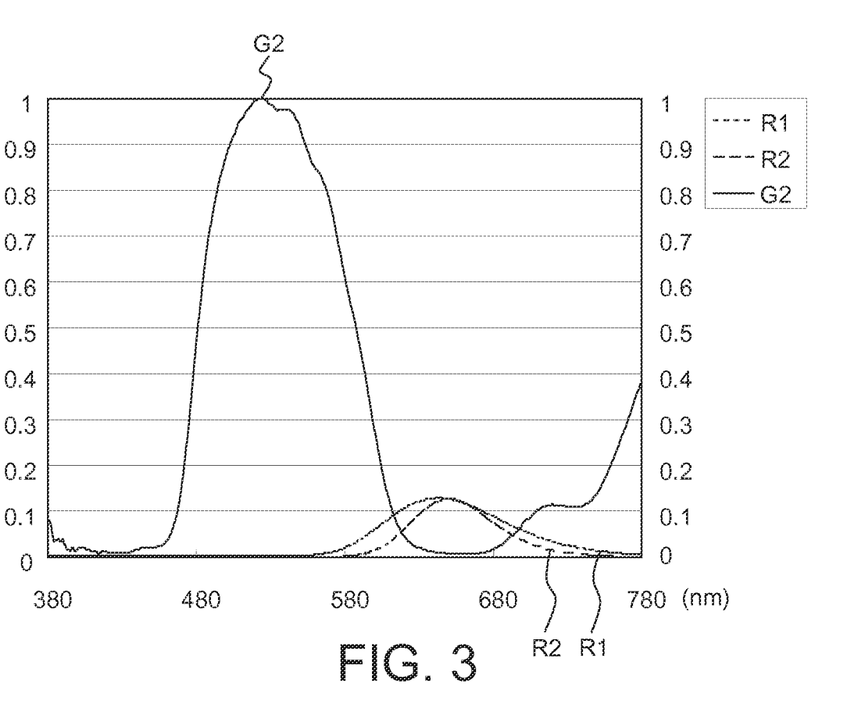
FIG. 3 shows a schematic diagram of a normalized emission spectrum of a red light of a light source and a normalized transmission spectrum of a green filter layer according to an embodiment of the invention.

FIG. 3 shows a schematic diagram of a normalized emission spectrum (corresponding to the left side vertical axis) of the light source of the red light region and a normalized transmission spectrum (corresponding to the right side vertical axis) of the green filter layer according to an embodiment of the invention. A curve R1 is the emission spectrum of the ordinary light source of the red light region indicated in FIG. 2. A curve R2 is the emission spectrum of the light source in the red light region using sulfide type fluorescent powder. As indicated in FIG. 3, the full width at half maximum (FWHM) of the emission spectrum of the curve R2 is less than that of the curve R1. The positions of peaks of the curves R2 and R1 can be the same, and the invention is not limited thereto.

As indicated in FIG. 3, the ratio of the second energy (between 660 nm and 780 nm of wavelength) to the first energy (between 380 nm and 780 nm of wavelength) is about 2.87%, obtained according to an overlapping percentage between the curve R1 and the transmission spectrum G2 of the green filter layer. The ratio of the second energy (between 660 nm and 780 nm of wavelength) to the first energy (between 380 nm and 780 nm of wavelength) is about 1.2%, obtained according to an overlapping percentage between the curve R2 and the transmission spectrum G2 of the green filter layer. In comparison to the overlapping percentage between the emission spectrum of the curve R1 and the transmission spectrum G2 of the green filter layer, the overlapping percentage between the emission spectrum of the curve R2 and the transmission spectrum G2 of the green filter layer drops by 1.67%. That is, the light leak is reduced by 58%, largely reducing the problem of red light leak occurring to the green filter layer in the red light region. Therefore, by adjusting the material type or ingredient percentages of the light source providing the red light, the ratio of the second energy to the first energy can be reduced to be less than 2%. Preferably, the ratio of the second energy to the first energy is reduced to be less than 1%. By controlling the percentage of red light leak, red light leak which occurs when the light of the light source passes through the green filter layer is reduced, the problem of the chromaticity coordinates of the white dot can be avoided and display quality is improved.

Figure 4:
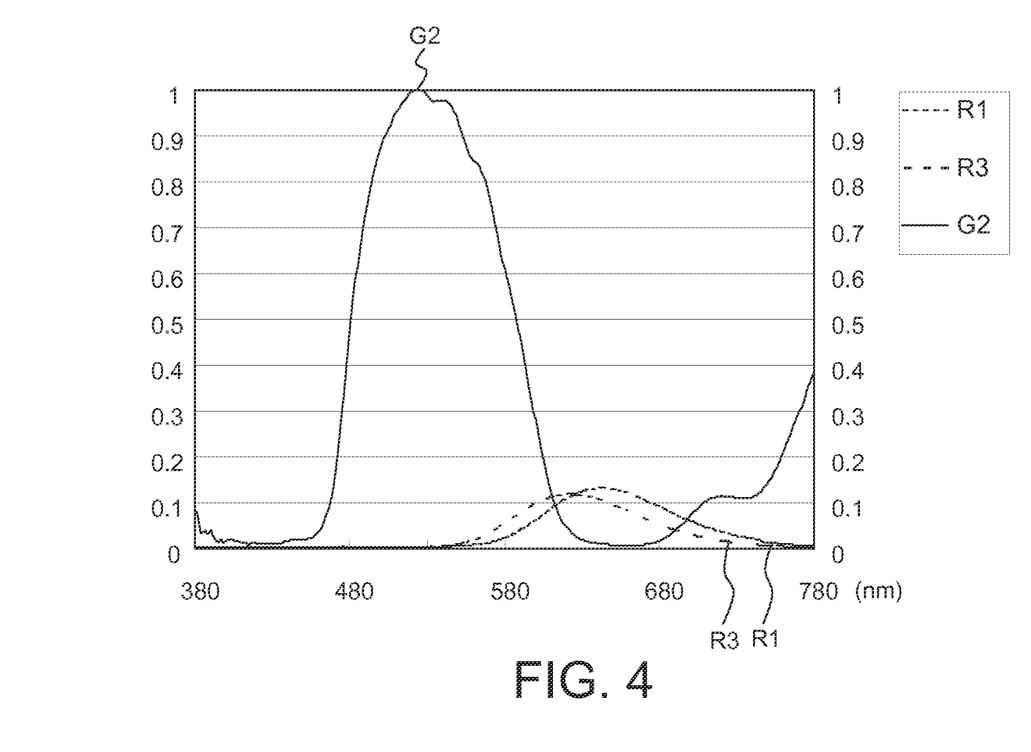
FIG. 4 shows a schematic diagram of a normalized emission spectrum of a red light region of a light source and a normalized transmission spectrum of a green filter layer according to an embodiment of the invention.

FIG. 4 shows a schematic diagram of a normalized emission spectrum (corresponding to the left side vertical axis) of the light source of the red light region and a normalized transmission spectrum (corresponding to the right side vertical axis) of the green filter layer according to an embodiment of the invention. The curve G2 is a transmission spectrum of the green filter layer shown in FIG. 2. The curve R1 is an emission spectrum of the ordinary light source of the red light region shown in FIG. 2. A curve R3 is an emission spectrum of the light source using nitride fluorescent powder and has a main peak corresponding to a wavelength of 620 nm. In comparison to the main peak of the curve R1, the peak of the curve 3 is displaced towards the short wavelength area (leftward displacement). Therefore, the ratio of the second energy (between 660 nm and 780 nm of wavelength) to the first energy (between 380 nm and 780 nm of wavelength) is about 1.3%, obtained according to the overlapping percentage between the emission spectrum of the curve R3 and the transmission spectrum G2 of the green filter layer represented by. In comparison to the overlapping percentage between the emission spectrum of the curve R1 and the transmission spectrum G2 of the green filter layer (2.87%) shown in FIG. 4, and the overlapping percentage between the emission spectrum of the curve R3 and the transmission spectrum G2 of the green filter layer (1.3%) drops by 1.57%. That is, the light leak is reduced by 55%, largely reducing the problem of red light leak occurring to the green filter layer in the red light region. Therefore, by adjusting the material type or ingredient percentages of the light source providing the red light, the ratio of the second energy to the first energy can be reduced to be less than 2%. Preferably, the ratio of the second energy to the first energy is reduced to be less than 1%. By controlling the percentage of red light leak, less red light leak will occur when the light of the light source passes through the green filter layer.

Figure 5:
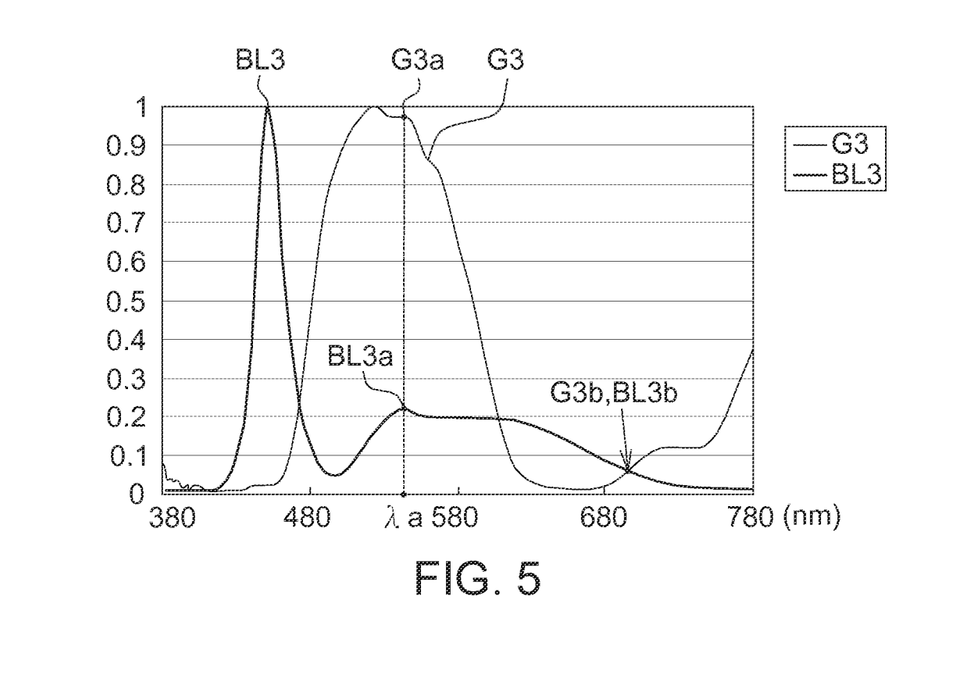
FIG. 5 shows a schematic diagram of a normalized emission spectrum of a red light of a light source and a normalized transmission spectrum of a green filter layer according to an embodiment of the invention.

FIG. 5 shows a schematic diagram of a normalized emission spectrum of the light source and a normalized transmission spectrum of the green filter layer according to an embodiment of the invention. A curve G3 denotes the normalized transmission spectrum of the green filter layer according to an embodiment of the invention. A curve BD denotes a normalized emission spectrum of the light source according to an embodiment of the invention. In the present embodiment, after the emission spectrum and the transmission spectrum are normalized, the emission spectrum and the transmission spectrum are illustrated in the same spectrum diagram according to the Cartesian coordinates, such that the emission spectrum and the transmission spectrum can use the same coordinate ranges in the x-axis and the y-axis. As indicated in the spectrum diagram of FIG. 5, the horizontal axis corresponds to the wavelength of the light able to pass through the green filter layer and the emission wavelength of the light source (the unit is nm). The vertical axis corresponds to the normalized transmission rate of the wavelength of the light able to pass through the green filter layer. The value of the vertical axis is an arbitrary unit.

In the present embodiment, the emission spectrum (curve BL3) of the light source may comprise a blue light region, a green light region and a red light region for providing a blue light region, a green light region and a red light region, respectively. The red light region can be generated by a group consisting of a red fluorescent powder, a red light emitting diode chip, a red quantum dot, an OLED or a combination thereof. The red fluorescent powder may comprise nitride, such as a nitride whose light emitting peak corresponds to a wavelength between 600 nm and 630 nm (such as 620 nm), or a material whose emission spectrum of red light region has narrower full width at half maximum, such as sulfide.

In the present embodiment, in the wavelength range between 480 nm and 660 nm, the product of the maximum peak value BL3$a$ of the normalized emission spectrum BL3 of the light source corresponding to a wavelength $\lambda$a, and the transmittance intensity value G3$a$ corresponding to the wavelength $\lambda$a of the normalized transmission spectrum G3 of the green filter layer is a first product value. In the wavelength range between 660 nm and 780 nm, the product of the illumination intensity value BL3$b$ of the normalized emission spectrum BL3 and the transmittance intensity value G3$b$ of the normalized transmission spectrum G3, corresponding to a cross-point between the normalized emission spectrum BL3 and the normalized transmission spectrum G3, is a second product value. The ratio of the second product value to the first product value is less than 2%. Preferably the ratio of the second product value to the first product value is reduced to be less than 1%.

In an exemplary embodiment, as indicated in FIG. 5, in the wavelength range between 480 nm and 660 nm, the maximum emission peak value of the normalized emission spectrum BL3 is 0.22, and the transmittance intensity value of the normalized transmission spectrum G3 corresponding to the wavelength value corresponding to the maximum emission peak value is 0.97, so the first product value is 0.2134. In the wavelength range between 660 nm and 780 nm, the illumination intensity value of the normalized emission spectrum BL3 corresponding to a cross-point between the normalized emission spectrum and the normalized transmission spectrum is 0.06, and the transmittance intensity value of the normalized transmission spectrum G3 corresponding to the cross-point is 0.06, so that the second product value is 0.0036. Therefore, the ratio of the second product value to the first product value is 1.69% which is less than 2%. The ratio of the second product value to the first product value is preferably less than 1%, by adjusting the material types and ingredient percentage of the red fluorescent powder, the red light emitting diode chip, the red quantum dot, or the OLED used in the light source to make the peak of the red light region have narrower full width at half maximum or shift the peak towards short wavelength. For example, the ratio of the second product value to the first product value is less than 1%, by adjusting the ingredients of sulfide, nitride or silicide of the red fluorescent powder to shift the peak of the red light region towards short wavelength.

Figure 6:
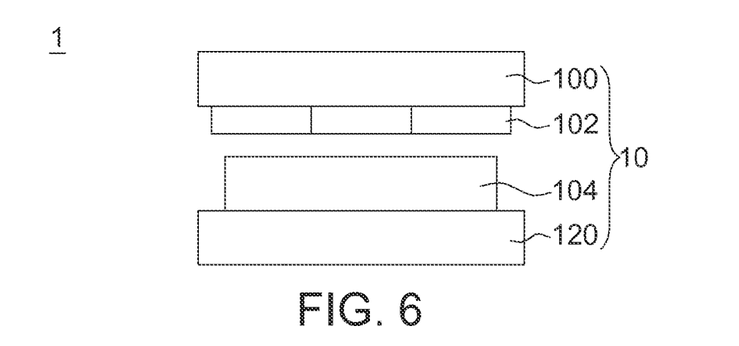
FIG. 6 shows a schematic diagram of an organic light emitting diode (OLED) display module according to an embodiment of the invention.

A display module applying the above embodiments of the invention is exemplified below. Referring to FIG. 6, a schematic diagram of an organic light emitting diode (OLED) display module 1 according to an embodiment of the invention is shown. As indicated in FIG. 6, the OLED display module 1 comprises a display unit 10. The display unit 10 comprises a first substrate 100, a color filter layer 102, an organic light emitting unit 104, and a second substrate 120. The organic light emitting unit 104 is disposed between the first substrate 100 and the second substrate 120. The color filter layer 102 is disposed on the first substrate 100, and may comprise a blue filter layer, a green filter layer and a red filter layer. The color filter layer 102 can be disposed on the second substrate 120 according to the viewer's position, and the invention is not limited thereto. The organic light emitting unit 104 is the display medium providing grey scales and the light source at the same time.

The light source generated by the organic light emitting unit 104 may comprise several spectrum regions of different colors, such as a blue light region, a green light region and a red light region, corresponding to the transmission spectrum of the blue light emitting unit, the transmission spectrum of the green light emitting unit and the transmission spectrum of the red light emitting unit, respectively. In an embodiment, the light of different regions can be provided by different elements or materials. For example, the light of the blue light region can be provided by a blue LED, and the light of the red region can be provided by an OLED, and the invention is not limited thereto. Suitable design can be used as long as the emission spectrum of the light source and the transmission spectrum of the green filter layer are conformed to the ratio of the second energy to the first energy being less than 2% as indicated in FIG. 3~4 or are conformed to the ratio of the second energy to the first energy being less than 2% as indicated in FIG. 5.

Figure 7:
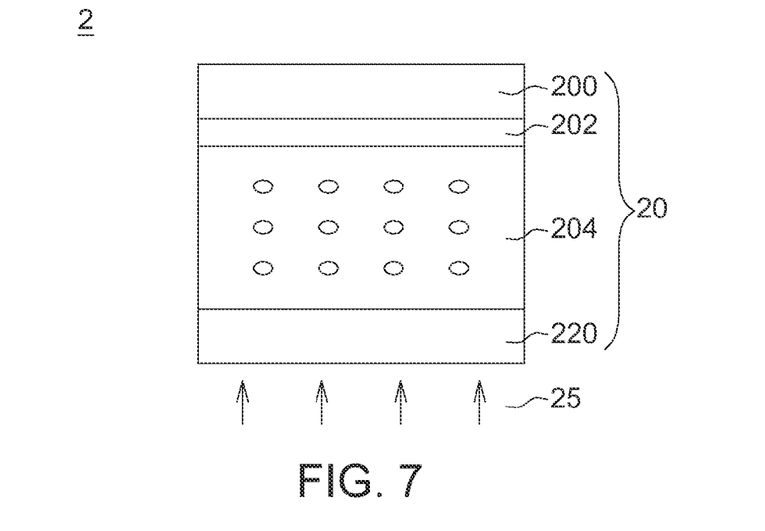
FIG. 7 shows a structural diagram of a liquid crystal display module (LCD) according to an embodiment of the invention.

Referring to FIG. 7, a structural diagram of a liquid crystal display (LCD) module 2 according to an embodiment of the invention is shown. As indicated in FIG. 7, the liquid crystal display module 2 comprises a display unit 20 and a backlight unit 25. FIG. 7 only illustrates a first substrate 200, a color filter layer 202, a liquid crystal molecule layer 204 and a second substrate 220 of the display unit 20, and other elements (such as electrodes) are omitted, for easy explanation for embodiments. The color filter layer 202 is disposed on the first substrate 200. However, the color filter layer 202 may also be disposed on the second substrate 220, such as color filters on a thin film transistor array substrate (COA). The position of the color filter layer 202 is not subjected to specific restrictions.

The backlight unit 25 is used for providing the light source comprising several spectrum regions of different colors, such as a blue light region, a green light region and a red light region. The backlight unit 25 can be implemented in different ways for providing the light source. For example, the backlight unit 25 can be implemented by packaging the red and the green fluorescent powders and the blue light emitting diode (LED) together, or packaging the YAG fluorescent powder and the blue LED together. The emission spectrum of the light source may comprise several regions of different colors (such as a blue light region, a green light region and a red light region). The red light region can be generated by a group consisting of a red fluorescent powder, a red light emitting diode chip, a red quantum dot, an OLED or a combination thereof.

In an embodiment, the red fluorescent powder comprises sulfide. In another embodiment, the material of the red light emitting unit can be designed to have a nitride whose light emitting peak is between 600 nm and 630 nm (such as 620 nm) of wavelength. The types of the blue light emitting unit and the green light emitting unit can be different from that of the red light emitting unit, and the invention is not limited thereto. For example, the red light emitting unit can be realized by an OLED, and the blue light emitting unit and the green light emitting unit can be realized by an LED. Moreover, the red light region and the green filter layer of the backlight unit 25 are conformed to the design of the ratio of the second energy to the first energy being less than 2% as indicated in FIG. 4~5 or are conformed to the design of the ratio of the second energy to the first energy being less than 2% as indicated in FIG. 5.

The above embodiments of the invention can also be applied to a touch type display device. In some embodiments, the display module 1 and the display module 2 may further comprise a touch unit (not illustrated). The touch design of the touch unit comprises a touch sensing circuit (not illustrated) and may be integrated with one of the substrates of the above embodiments. The present embodiment uses the in-cell or the on-cell touch technology, such as the in-cell photo technology, the in-cell capacitive technology, the in-cell resistive technology and the on-cell capacitive technology, for touch sensing control. Also, the touch sensing circuit can be realized by a multi-touch sensing circuit, and the invention is not limited thereto.

To summarize, given that the standards of the transmission rate of the light source and the white dot are satisfied, the display module of the above embodiments of the invention can effectively control the percentage of red light leak and reduce the red light leak which occurs when the light of the light source passes through a green filter layer, such that the display module has better display quality.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. A display module having a light source, wherein the display module comprises:
   a display unit, comprising:
   a first substrate;

a second substrate;
a display medium disposed between the first substrate and the second substrate; and
a green filter layer disposed on the first substrate, wherein
an emission spectrum of the light source between 380 nm and 780 nm of wavelength passing through the green filter layer corresponds to a first energy,
the emission spectrum of the light source between 660 nm and 780 nm of wavelength passing through the green filter layer corresponds to a second energy, and
a ratio of the second energy to the first energy is less than 2%.

2. The display module according to claim 1, wherein the ratio of the second energy to the first energy is less than 1%.

3. The display module according to claim 1, wherein the emission spectrum of the light source comprises a red light region, and the light source comprises a red light emitting diode chip, a red quantum dot, an organic light emitting diode (OLED) or a combination thereof.

4. The display module according to claim 1, wherein the emission spectrum of the light source comprises a red light region generated by a red fluorescent powder, and a material of the red fluorescent powder comprises sulfide, nitride or silicide.

5. The display module according to claim 4, wherein the material of the red fluorescent powder is nitride, and a peak of the emission spectrum in the red light region is between 600 nm and 630 nm of wavelength.

6. The display module according to claim 1, wherein the display medium is an organic light emitting unit.

7. The display module according to claim 1, further comprising:
a backlight unit for providing the light source, the display medium being a liquid crystal molecule layer.

8. The display module according to claim 1, wherein a product of the emission spectrum and a transmission spectrum of the green filter layer is a multiplication spectrum, the first energy is an integral area of the multiplication spectrum between 380 nm and 780 nm of wavelength, and the second energy is an integral area of the multiplication spectrum between 660 nm and 780 nm of wavelength.

9. A display module having a light source, wherein the light source has an emission spectrum, and the display module comprises:
a display unit, comprising:
a first substrate;
a second substrate;
a display medium disposed between the first substrate and the second substrate; and
a green filter layer disposed on the first substrate and having a transmission spectrum, wherein
a product of a first illumination intensity value corresponding to a maximum peak wavelength of the emission spectrum of the light source between 480 nm and 660 nm of wavelength and a first transmittance intensity value corresponding to the maximum peak wavelength of the transmission spectrum of the green filter layer is a first product value,
wherein the emission spectrum and the transmission spectrum between 660 nm and 780 nm of wavelength has a cross-point, and a product of a second illumination intensity value of the emission spectrum corresponding to the cross-point and a second transmittance intensity value of the transmission spectrum corresponding to the cross-point is a second product value, and a ratio of the second product value to the first product value is less than 2%, wherein the emission spectrum and the transmission spectrum are normalized.

10. The display module according to claim 9, wherein the ratio of the second product value to the first product value is less than 1%.

11. The display module according to claim 9, wherein the emission spectrum of the light source comprises a red light region, and the light source comprises a red light emitting diode chip, a red quantum dot, an OLED or a combination thereof.

12. The display module according to claim 9, wherein the emission spectrum of the light source comprises a red light region generated by a red fluorescent powder, and a material of the red fluorescent powder comprises sulfide, nitride or silicide.

13. The display module according to claim 12, wherein the material of the red fluorescent powder is nitride, and a peak of the red light region of the emission spectrum is between 600 nm and 630 nm.

14. The display module according to claim 9, further comprising:
a backlight unit for providing the light source, the display medium being a liquid crystal molecule layer.

15. The display module according to claim 9, wherein the display medium is an organic light emitting unit for providing the light source.

* * * * *